United States Patent [19]

Bjornard et al.

[11] Patent Number: 5,489,369
[45] Date of Patent: Feb. 6, 1996

[54] METHOD AND APPARATUS FOR THIN FILM COATING AN ARTICLE

[75] Inventors: Erik J. Bjornard; Eric W. Kurman, both of Northfield; Debra M. Steffenhagen, Faribault, all of Minn.

[73] Assignee: Viratec Thin Films, Inc., Faribault, Minn.

[21] Appl. No.: 142,638

[22] Filed: Oct. 25, 1993

[51] Int. Cl.⁶ .......................... C23C 14/56; C23C 14/50; C23C 16/00
[52] U.S. Cl. .................. 204/298.25; 204/298.07; 204/298.11; 204/298.15; 204/298.23; 204/298.26; 118/719; 118/720; 118/721; 118/728; 118/500; 118/504
[58] Field of Search .................... 204/298.11, 298.15, 204/298.23, 298.25, 298.26, 298.07; 118/719, 720, 721, 728, 729, 500, 504, 505; 269/908

[56] References Cited

U.S. PATENT DOCUMENTS

| | | |
|---|---|---|
| 2,093,699 | 9/1937 | Varian et al. .......................... 313/450 |
| 3,679,451 | 7/1972 | Marks et al. .......................... 220/2.1 R |
| 3,940,511 | 2/1976 | Deal et al. ............................... 427/165 |
| 3,945,903 | 3/1976 | Svendor et al. .................... 204/298.25 |
| 4,274,936 | 6/1981 | Love ................... 204/298.25 |
| 4,533,449 | 8/1985 | Levenstein .......................... 204/192.26 |
| 4,548,698 | 10/1985 | Sellschopp .......................... 204/298.11 |
| 4,692,233 | 9/1987 | Casey ................... 204/298.25 |
| 4,755,716 | 7/1988 | Hayafune et al. ....................... 313/478 |
| 4,979,919 | 12/1990 | Toyama ....................... 445/45 |
| 4,982,695 | 7/1991 | Brennesholtz et al. .................. 118/729 |
| 5,084,649 | 1/1992 | Sasao ........................... 313/474 |
| 5,122,709 | 6/1992 | Kawamura et al. ..................... 313/479 |
| 5,382,126 | 1/1995 | Hartig et al. ............................ 414/217 |

FOREIGN PATENT DOCUMENTS 1-146627  6/1989  Japan ...................................... 269/908

Primary Examiner—R. Bruce Breneman
Assistant Examiner—Rodney G. McDonald
Attorney, Agent, or Firm—Dorsey & Whitney

[57] ABSTRACT

A method and apparatus for coating a CRT screen after assembly. The method and apparatus includes isolating a surface portion of the CRT to be coated from the remaining surface to prevent or minimize coating problems resulting from outgassing and to isolate noncompatible components from the deposition environment.

16 Claims, 9 Drawing Sheets

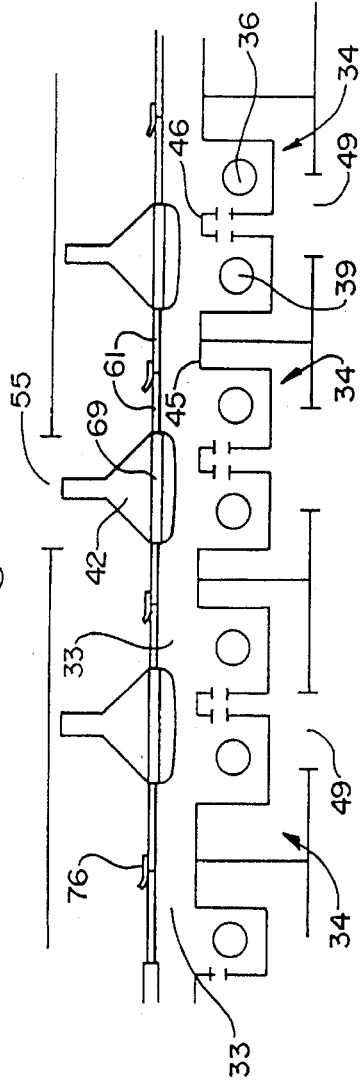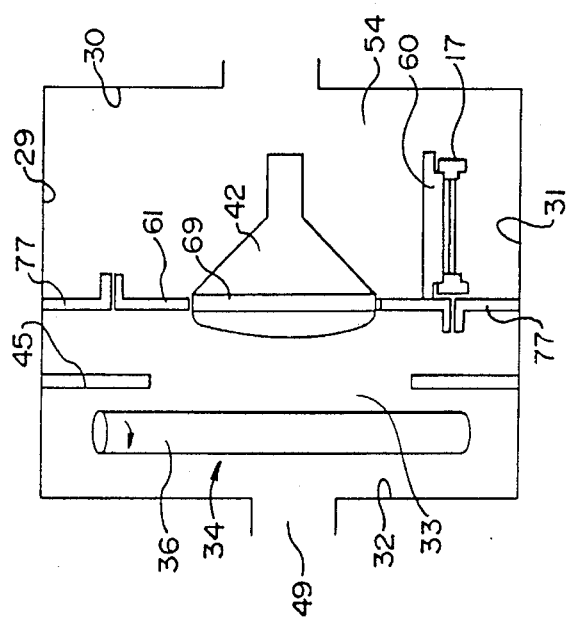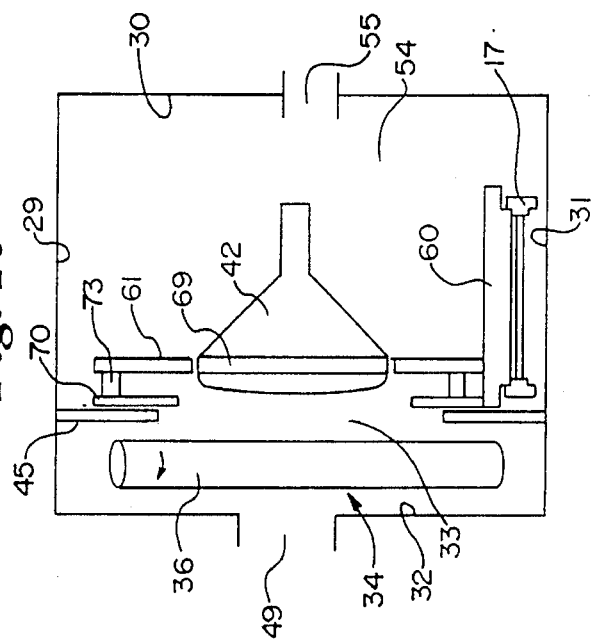

METHOD AND APPARATUS FOR THIN FILM COATING AN ARTICLE

BACKGROUND OF THE INVENTION

1. Field of the Invention

The present invention relates generally to a method and apparatus for applying a thin film coating to an article and more particularly to a method and apparatus for providing a thin film coating to a portion of an article while substantially isolating other portions of the article from the coating environment. In a preferred embodiment, the present invention relates to a method and apparatus for applying a thin film coating to the front face of a cathode ray tube (CRT) after assembly using a thin film deposition technique such as sputtering.

2. Summary of the Prior Art

Although the invention has general application to the thin film coating of an article through a variety of thin film deposition techniques such as electron beam deposition, chemical vapor deposition and sputtering, among others, it has particular applicability to the application of a thin film anti-reflective or other coating onto the front face or screen of a CRT after assembly.

A major objective of designers and manufacturers of displays using CRTs is to reduce glare resulting from the reflection of ambient light off the CRT face. Several approaches have been used in the prior art to achieve glare reduction on CRT screens. One approach has involved surface treatment of the screen by chemical etching such as by means of a hydrofluoric acid solution. Examples are disclosed in U.S. Pat. Nos. 3,679,451 issued to Marks et al. and 3,941,511 issued to Deal et al. Both methods seek to reduce glare from the CRT face by providing a treated surface which scatters incident light while still maintaining good transmittance of light emanating from the CRT face. In general, however, anti-reflective coatings applied through chemical etching achieve only minimal glare reduction and usually result in degradation of the resolution.

A further approach to glare reduction has been to provide a CRT with an anti-glare filter consisting of a piece of glass or other material having an anti-reflective view surface. The filter is placed in a frame and suspended in front of the CRT view surface. In such a device, the glass filter may be tinted or bear an absorbing coating to provide contrast enhancement. Such a device is known as a contrast enhancement filter. Coatings onto the glass filter may also be in the form of optical interference coatings applied to the glass surface by means of physical vapor deposition methods such as sputter and evaporative deposition. They may also be applied by means of chemical vapor or by liquid deposition methods such as spin or dip coating.

A third approach has been to apply optical interference coatings to a CRT screen prior to assembly into a finished unit. For such method to be successful, however, the applied coating must be able to survive the subsequent processing steps during assembly of the unit. The most challenging of these subsequent processing steps is the "frit sealing" step in which the face plate is sealed to the funnel of the CRT by using a paste comprised of glass and ceramic particles. The temperatures needed for the frit seal process may be as high as 450° C. Many optical interference coatings will undergo an irreversible and deleterious alteration of their properties on exposure to these processing conditions. Such changes may also alter optical thicknesses and electrical conductivity optical constants of several of the layers, thereby resulting in a loss of desired optical or electrical conductivity properties.

A still further approach known in the art for providing a CRT screen with anti-reflective properties is to coat a piece of glass with an anti-reflective coating and then bond the glass directly to the CRT. Such a process is known in the art as bonded panel construction. Such processes are expensive since they require a precision bent glass substrate and can result in significant yield loss because of the CRTs and panels which must be discarded due to imperfections in the process.

A desirable feature of anti-reflective coatings intended for CRT face plates or glare filters regardless of the application process, is electrical conductivity. Such conductivity should preferably be sufficient to facilitate the dissipation of static electrical charges and thereby reduce accumulation of dust on the CRT or filter. Electrically conductive coatings are not possible with methods involving chemical etching. Even with the other processes described above, where electrically conductive coatings are possible, additional time consuming processing steps must be undertaken to electrically connect the coating to the implosion band or other grounding component so that the static charges can be dissipated.

Attempts to directly coat the face plates of CRTs or other similar articles after assembly have not proven to be successful. Several reasons exist for this. First, many of the materials and components in the finished CRT are not compatible with the conditions existing in a thin film deposition environment such as, for example, magnetron sputter deposition environments. Second, an assembled CRT embodies various polymeric materials including electronic and other components at the rear of the CRT. These tend to "outgas" or release volatile contaminants when subjected to the heat, vacuum and ion bombardment of thin film deposition environments. Such volatile contaminants may include water vapor, plasticizers, solvents and oligomers. The presence of these outgas components adversely affect the coating process and operation of the deposition equipment. This in turn adversely affects the quality and characteristics of the anti-reflective coating. Although outgassing can be reduced by exposing the assembled CRT to vacuum conditions for an extended period prior to coating, this is time consuming and expensive.

Accordingly, there is a need in the art for an improved method and apparatus for providing the face plate or screen of CRTs and other similar articles with an anti-reflective or other coating which is cost effective and which overcomes the problems currently existing in the prior art. A more specific need exists for a method and apparatus for directly coating a CRT face plate or other article after assembly with a highly acceptable coating without regard to interference by outgassing from assembled CRT components and without regard to the incompatibility of such components to the deposition environment.

SUMMARY OF THE INVENTION

In contrast to the prior art, the present invention provides a method and apparatus for direct coating of an article such as a CRT face plate or screen, after assembly, by a thin film deposition technique such as magnetron sputtering. This is accomplished by substantially isolating noncompatible and outgas producing components of the assembled CRT from the deposition environment, thereby preventing exposure of the noncompatible components to the deposition chamber and significantly reducing, if not eliminating, outgassing problems which would otherwise adversely affect the deposition process and coating quality. The method and apparatus of the present invention also facilitates direct coating of the face plate of a CRT with a conductive coating which extends onto a portion of the implosion band or other grounding component, thereby providing an efficient method and apparatus for electrically connecting the coating with a static dissipating connection.

In accordance with the preferred embodiment of the method and apparatus of the present invention, the CRT or other article to be coated is processed in a thin film deposition system in which the CRT face plate or that part of an article which is to be coated is exposed to a deposition environment and the remainder is substantially isolated from such environment. In the preferred embodiment, this is accomplished by supporting the CRT so that its front face is exposed to a plurality of deposition process zones and by providing a barrier which substantially isolates the non-coated portion of the article from the deposition environment and thus substantially limits exposure of the deposition environment to the portion of the article to be coated. This substantial isolation may also be accomplished by maintaining a pressure differential between the deposition and exhaust zones to substantially preclude migration or movement of outgasses and other contaminants into the deposition zone.

In the most preferred method and apparatus, the present invention provides a continuous, in-line processing system in which CRTs or other articles to be coated are continuously passed through the system. The system includes an entry and an exit buffer chamber and a plurality of sequential deposition or process zones to which the CRT face plates are exposed during passages through the system. During passage of the CRTs through the system, the components of the CRT which are not compatible with the deposition environment as well as the possible outgassing sources are substantially isolated from the deposition or process zone.

Accordingly, it is an object of the present invention to provide an improved method and apparatus for providing a CRT face plate or a selected portion of another article with an anti-reflective or other coating.

Another object of the present invention is to provide a method and apparatus for directly coating the face plate of a CRT or other article after assembly.

A still further object of the present invention is to provide a method and apparatus for directly providing a CRT face plate with an anti-reflective coating which is electrically conductive and in which the coating extends to and is electrically connected with a dissipation contact.

A still further object of the present invention is to provide a method and apparatus for directly providing a CRT face plate with an anti-reflective coating via sputtering in which the coating can be applied after assembly without concern for outgassing problems.

These and other objects of the present invention will become apparent with reference to the drawings, the description of the preferred method and apparatus, and the appended claims.

DESCRIPTION OF THE DRAWINGS

FIG. 15 is a schematic top illustration, similar to claim 7, showing an alternate embodiment of the barrier means for separating the deposition and exhaust zones.

FIG. 16 is a schematic end illustration of the embodiment shown in FIG. 7.

FIG. 17 is a schematic end illustration of the embodiment shown in FIG. 15.

DESCRIPTION OF THE PREFERRED METHOD AND APPARATUS

The present invention relates to a method and apparatus for applying a thin film coating to an article and a carrier for use in such apparatus and method. More particularly, the method and apparatus relates to applying a coating to a first surface portion of such article while substantially isolating the remaining surface portion of such article. It is contemplated that the present invention has applicability and can be used to apply such a coating to a variety of articles where selective coating of a portion of the article is desired; however, the present invention is particularly effective in applying a thin film coating onto the screen or front face of a CRT. Further, although the method and apparatus can be used to apply such a coating at various stages of assembly, it has particular advantages when applied to the screen of a fully assembled CRT or to other articles where the non-coated surfaces provide outgas sources.

Except as specifically limited, the reference in the present application to a thin film deposition device or process is intended to include all devices and equipment capable of applying a thin film coating. Included are devices such as electron beam deposition devices, chemical vapor deposition devices and sputtering devices, among others. The preferred embodiment of the present invention, however, is described with respect to a DC magnetron sputtering device. Further, a variety of coatings can be applied including antireflective coatings, conductive coatings for touch screens and the like. The preferred coating, however, is an antireflective coating.

Figure 1:
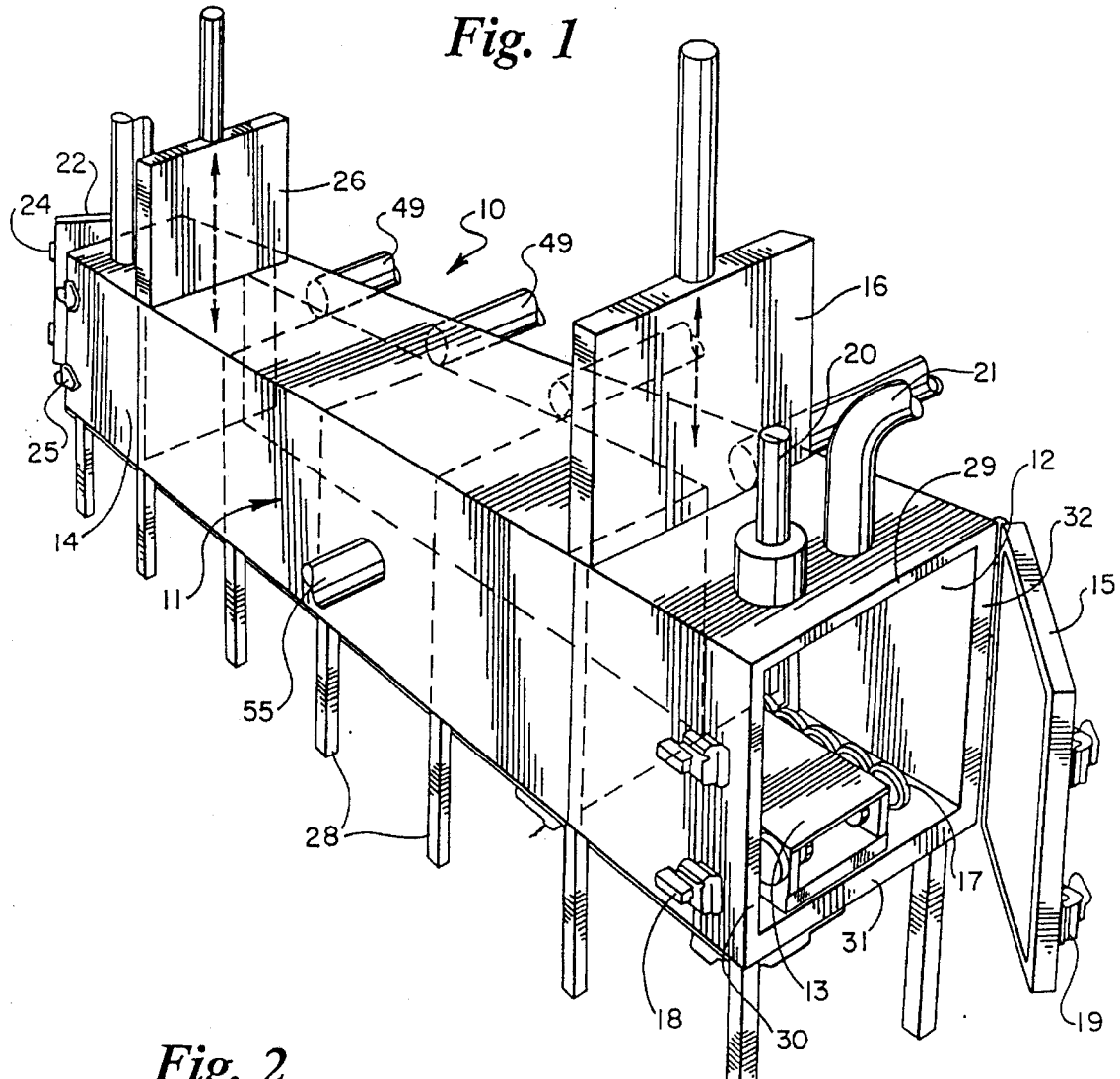
FIG. 1 is a perspective view of the apparatus of the present invention.

General reference is first made to FIG. 1 comprising a perspective view of the apparatus 10 of the present invention. The apparatus 10 includes an elongated housing with a centrally positioned process section 11 and end sections comprising entry and exit buffer chambers 12 and 14, respectively. The entry buffer chamber 12 is provided with an access door 15, with latch members 18 and 19 and with a slit or gate valve 16 for selectively isolating the interior of the chamber 12 from the process section 11. The chamber 12 is also provided with air supply means 20 and air exhaust means 21 for selectively providing ambient pressure conditions or vacuum conditions within the chamber 12. Similarly, the exit buffer chamber 14 is provided with a hinged door 22, latch members 24 and 25, a slit or gate valve 26 and air supply and exhaust means. Both chambers 12 and 14 function as buffer zones or chambers to facilitate entry of an article to be coated into, or exit of the coated article from, the process section 11.

The apparatus 10 is supported on a plurality of legs 28 and is provided with a top wall 29, a bottom wall 31 and a pair of side walls 30 and 32. Positioned within, and extending the entire length of, the apparatus 10 is a linear drive mechanism 13 having a plurality of spaced, rotatable wheels 17 for transporting the CRT carrier through the apparatus as will be described below.

Figure 7:
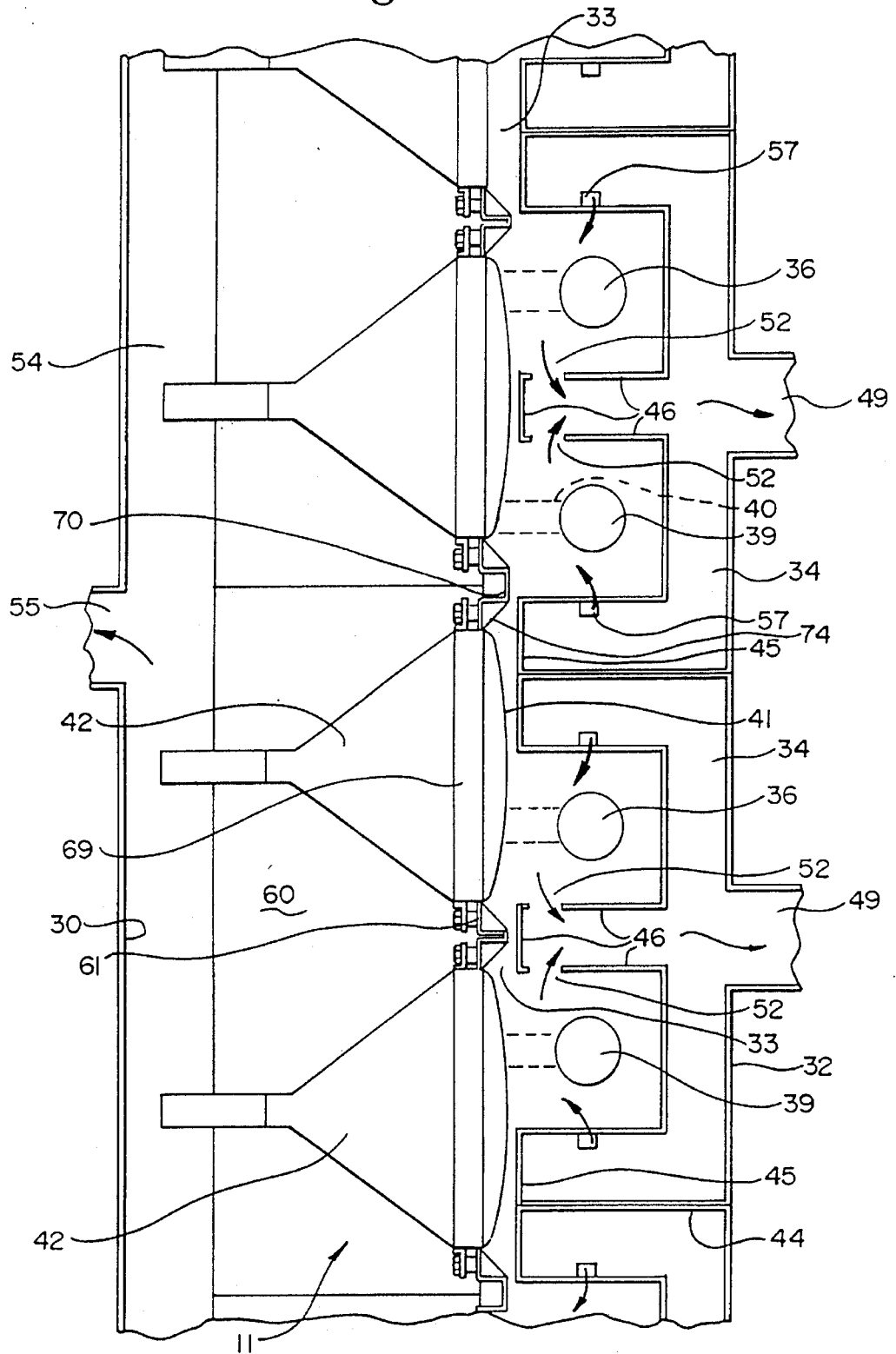
FIG. 7 is a top schematic illustration of the processing section of the apparatus of the present invention showing a plurality of deposition process zones and a plurality of double CRT carriers being moved through the apparatus.

The interior of one embodiment of the process section 11 of the apparatus 10 is illustrated schematically in FIGS. 7 and 16 and includes a plurality of side-by-side deposition process zones 34. Each of these zones 34 is provided with at least one thin film deposition device which, in the preferred embodiment, is a sputtering device 35 having a sputtering cathode 36. Preferably, each zone 34 is provided with a pair of sputtering devices 35 and 38 with corresponding sputtering cathodes 36 and 39. The cathodes 36 and 39 are rotatable cathodes which are constructed of a target material and function in accordance with technology known in the art. During operation, each of the cathodes 36 and 39 emits atoms or other small particles 40 for deposition onto the front screen 41 of a CRT 42 or other article to be coated.

Each of the deposition zones 34 is defined in part by a pair of end walls 44, the inner wall portions 45 including the cathode shielding portion 46, and the outer side wall 32. The outer side wall 32 includes a port 49 for evacuating the chamber 34 as described in greater detail below. As illustrated in the system schematic of FIG. 11, each of the evacuation ports 49 is connected with an evacuation or process zone pump 50. Depending upon various factors, including the particular reactive gases in each of the process zones 34, it is possible for several of the outlet ports 49, or in some cases all of the ports 49, to be connected with a common pump 50.

The plurality of deposition zones 34 are positioned generally in line and adjacent to one another to facilitate a continuous coating process. During operation, working or reactive gases are supplied to the sputtering devices 35 and 38 by means of a plurality of distribution manifolds 57. These manifolds direct the working gases toward the magnetron cathodes 36 and 39, causing emission of the particles 40 for deposition onto the CRT face 41. Following bombardment of the cathodes 36 and 39, the working gases flow through the openings 52 in the cathode shielding portion 46 and are then evacuated through the evacuation port 49.

Adjacent to the deposition process zones 34 and positioned between the zones 34 and the side wall 30 is an isolation or exhaust zone or plenum 54. The zone 54 extends the entire length of the process section 11 (FIG. 1) and is defined on its ends by the gate valves 16 and 26, is defined on its top and bottom by the top wall 29 and bottom wall 31 of the apparatus 10, on one of its sides by the side wall 30 and on its other side by various barrier surfaces of the CRT carrier as will be described below. The zone 54 is provided with a single outlet port 55 although multiple ports can be provided if desired. As illustrated in the schematic diagram of FIG. 11, a separate exhaust pump or system 56 is connected with the port 55 for generating reduced pressure within the zone 54.

Figure 2:
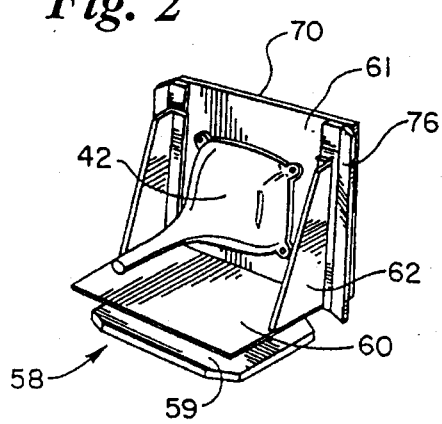
FIG. 2 is a perspective view of the rearward side of a CRT carrier usable in the apparatus illustrated in FIG. 1 with a CRT mounted therein.
Figure 4:
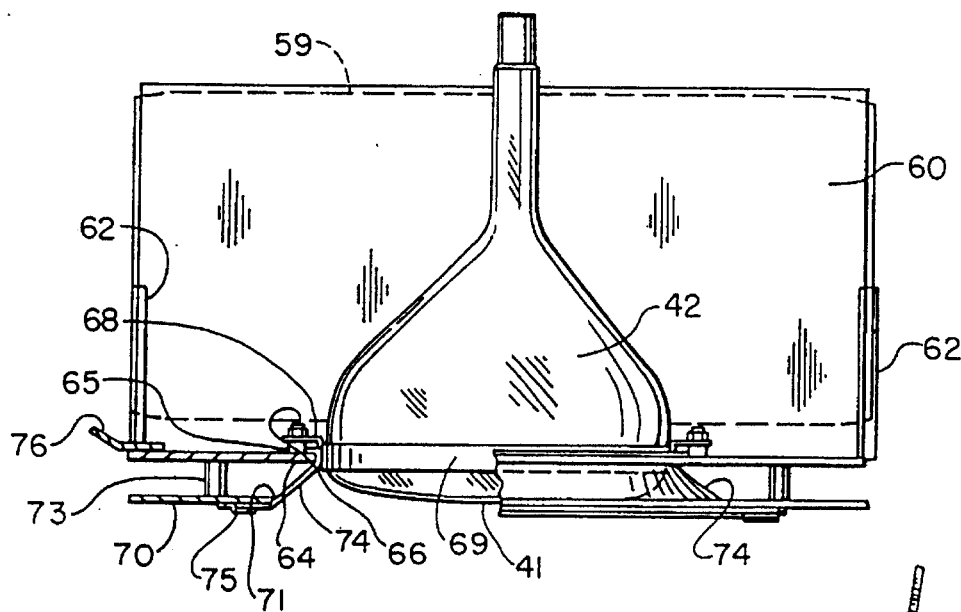
FIG. 4 is a top view, partially in section, of the CRT carrier of FIG. 2.
Figure 3:
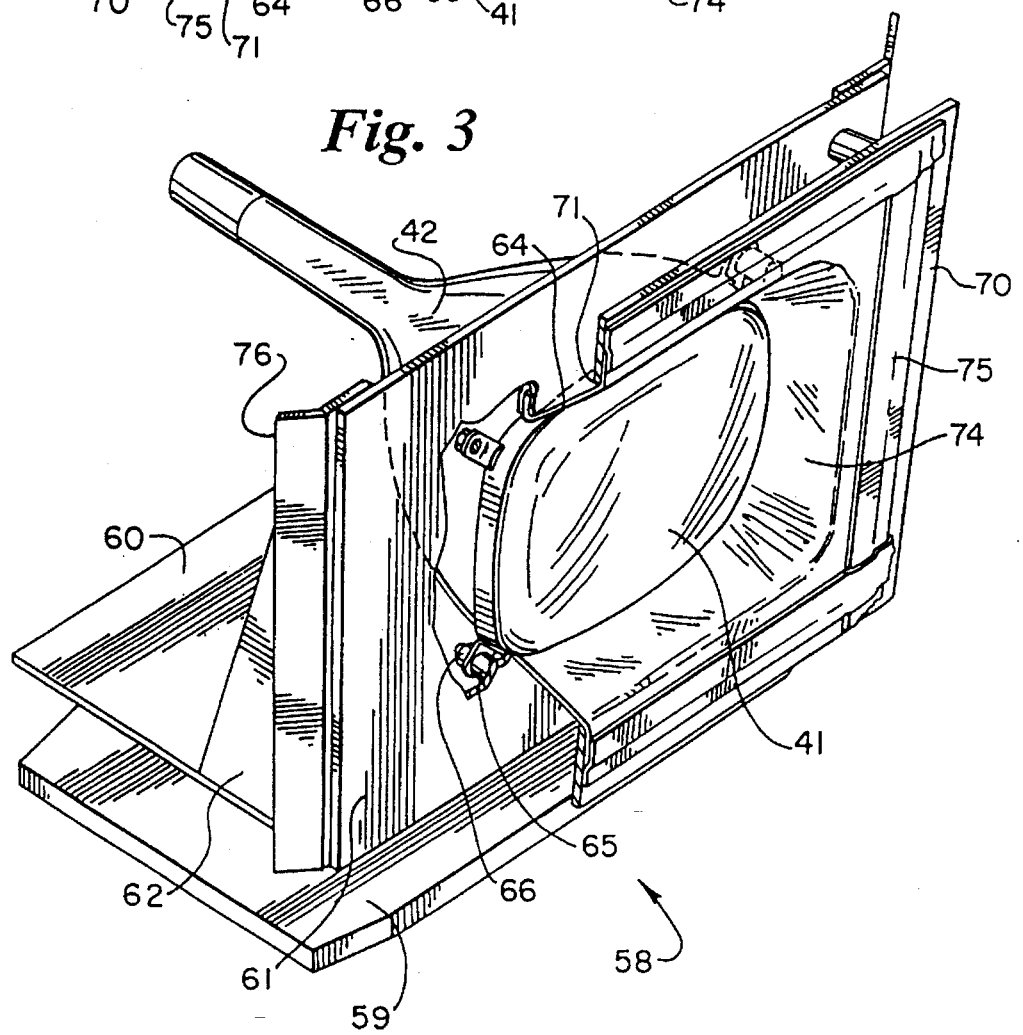
FIG. 3 is a perspective view of the front side of the CRT carrier of FIG. 2 with portions broken away.

As illustrated best in FIGS. 2, 3 and 4, a CRT carrier 58 supports a CRT 42. When used with the apparatus 10 of FIG. 1, the carrier 58 transports the CRT 42 past the deposition zones 34 for coating. At the same time, the carrier 58, in conjunction with portions of the process section 11, substantially isolates the deposition process zones 34 from the exhaust plenum 54 and thus the portions of the CRT 42 which are to remain uncoated. This isolation substantially reduces or eliminates outgassing problems and facilitates the coating of CRT screens following assembly.

Figure 8:
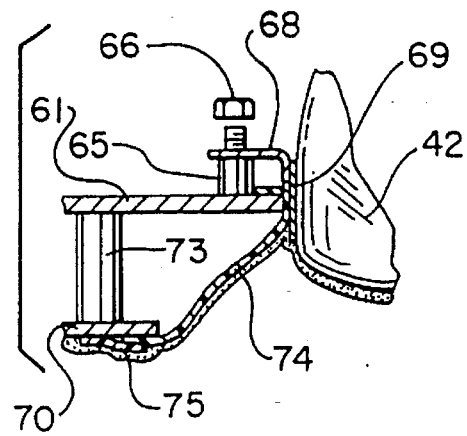
FIG. 8 is an enlarged illustration showing connection between the CRT and the CRT carrier of FIG. 2.

The carrier 58 includes a base 59 and a CRT support comprised of a bottom 60, a pair of side brackets 62 and a front, generally rectangular barrier plate 61. The bottom 60 is connected with the base 59 by appropriate connection means. The brackets 62 are secured to the bottom 60 and to the rearward surface of the plate 61 by welding or the like to support the plate in a generally vertical orientation at right angles relative to the bottom 60. As illustrated best in FIGS. 3 and 4, the barrier plate 61 is provided with a central opening 64 conforming substantially in size and configuration to a peripheral surface of the CRT 42. As shown in FIG. 8, the rearward surface of the plate 61 is provided with a plurality of standoffs 65 and threaded members 66 for connection with tabs or ears 68 extending from the implosion band 69 of the CRT. With this structure, the CRT 42 can be mounted relative to the barrier plate 61 with the face or screen 41 of the CRT 42 extending through the opening 64 and the remaining portion of the CRT 42 extending to the rear of the plate 61. Preferably, the barrier 61 engages the implosion band 69 in a sealing relationship by an elastomeric seal or the like so as to preclude passage of any outgas or other material between the opening 64 and the CRT 42 or band 69. In some cases, however, a small gap between the barrier 61 and the implosion band 69 can be tolerated if the quantity or partial pressure vapors, etc. of gases passing between the exhaust zone 54 and the process zones 34 are insignificant in comparison with the quantities or partial pressures of the reactive gases supplied to the sputter deposition process.

Figure 9:
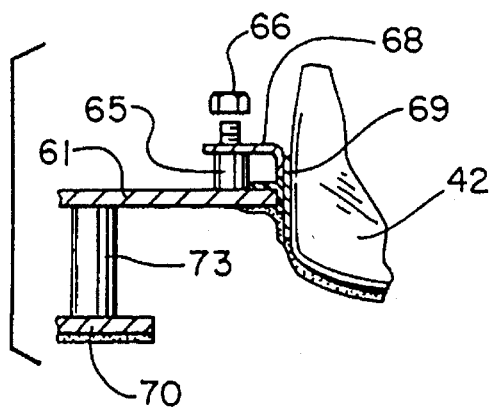
FIG. 9 is an illustration similar to that of FIG. 8 showing an alternate embodiment of the connection between the CRT and the CRT carrier.
Figure 10:
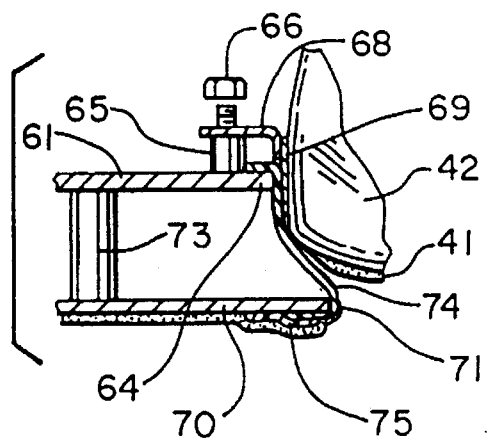
FIG. 10 is an illustration similar to that of FIG. 8 showing a further embodiment of the connection between the CRT and the CRT carrier.

Positioned forwardly of the barrier plate 61 is a generally rectangular mask or shield member 70 having a central opening 71 and top, bottom and side edges. The member 70 is mounted in spaced relationship relative to the barrier 61 by a plurality of standoff members 73. In the preferred embodiment, the central opening 71 is generally aligned with the opening 64 of the barrier 61 but is larger as illustrated best in FIGS. 3, 4, 5 and 8. Preferably, the shield member 70 is spaced forwardly from the barrier plate 61 a distance at least as great as the distance which the front face or screen 41 extends forwardly of the plate 61. A section of Kapton film is provided between the opening 71 of the mask 70 and the opening 64 of the barrier 61 to improve the separation and the isolation of the front face 41 of the CRT from the exhaust zone 54. The film 74 is secured to the front face of the mask 70 by a plurality of tape strips 75. As shown best in FIG. 8, the film 74 extends inwardly from the opening 71 and then past the opening 64. If needed or desired, the film 74 is retained relative to the barrier plate 61 by a plurality of tape strips (not shown). Preferably the film 74 is positioned relative to the front face 41 so that when the CRT is exposed to the deposition device, the coating extends over the entire front face 41 as well as a portion of the implosion band 69. Although provision of the film 74 is desirable, it is not necessary as shown in the alternate embodiment of FIG. 9. Further, as shown in FIG. 10, the opening 71 in the mask member 70 may be smaller than the opening 64 if a reduced portion of the front face 41 is desired to be coated.

Figure 6:
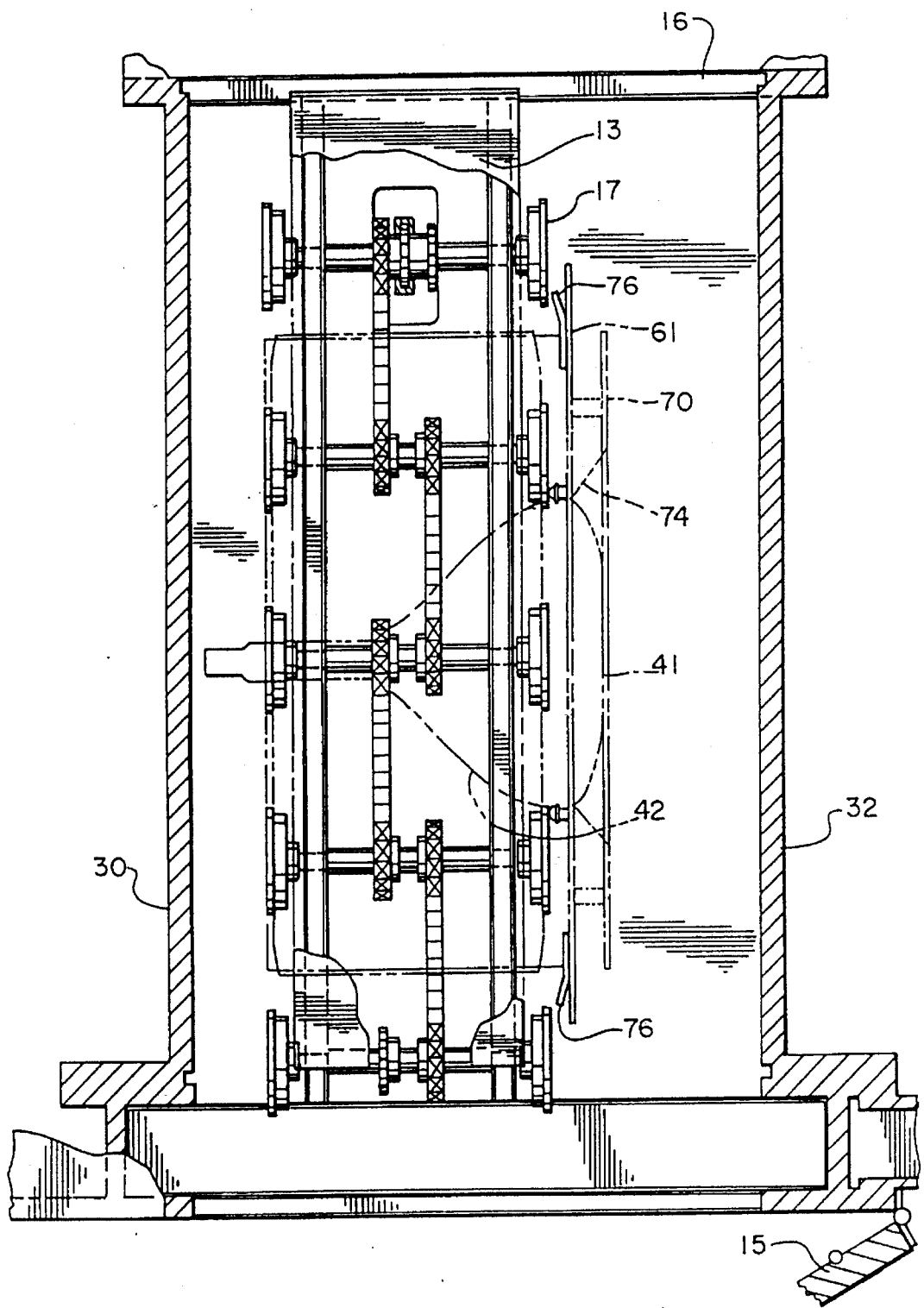
FIG. 6 is a top elevational view, with parts broken away, showing the linear drive mechanism for the CRT carriers and showing the CRT and CRT carrier of FIG. 2 in phantom within the entry buffer chamber.

Secured to one side of the barrier plate 61 is an overlapping edge tab 76 having an outer edge which is bent away from the plate 61 so as to overlap the plate 61 from an adjacent carrier as shown in FIG. 6. As best shown in FIG. 16, the shield 70 should be positioned as close to the wall 45 and shield portions 46 (FIG. 15) as possible. Further, the side edges of adjacent shield members 70 and adjacent barrier plates should be positioned as close together as possible. Minimizing the gap between these surfaces not only maximizes the isolation and separation between the exhaust and deposition zones 54 and 33, but, in the case of the gap between the shield 70 and the wall 45 and shield portions 46, also minimizes the contamination between adjacent deposition zones 33.

FIGS. 15 and 17 illustrate an alternate embodiment for separating the deposition and exhaust zones. In this alternate embodiment, the shield member 70 of the embodiment of FIGS. 7 and 16 has been eliminated and mating separation panel or barrier portions 77 are provided. The barrier portions 77 (shown best in FIG. 17) are connected with walls 29 and 31 and extend along the entire length of the process section 11. The portions 77 mate with end edges of the barrier plate 61. In the preferred embodiment, the ends of each edge of the plate 61 and portions 77 extend laterally to improve separation between the deposition and exhaust zones. The side edges of the barrier plates 61 of adjacent carriers in the embodiment of FIGS. 15 and 17 should be positioned as close as possible to minimize the gap between them and thus minimize transmission of gases from the exhaust zone 54 to the deposition zones 34. To further improve separation, an edge tab 76 may be provided between the barrier plate side edges of adjacent carriers 58.

Figure 12:
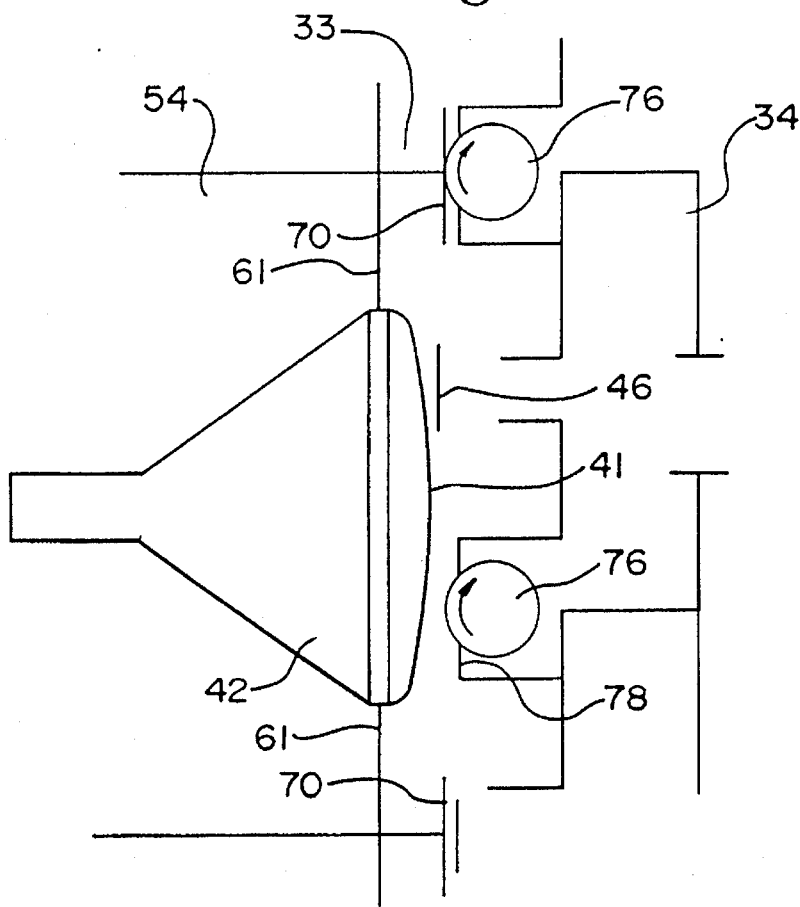
FIG. 12 is a schematic illustration of a modified structure showing means for improving isolation between adjacent process zones.

FIG. 12 illustrates a structure for obtaining improved separation or isolation between adjacent process zones 34. Such isolation may be desirable in cases where different working or reactive gases are used in adjacent process zones. In FIG. 12, a sealing roller 76 is mounted such that a portion extends through an opening in the wall portion 78. By providing a shield or barrier 70 of sufficient length, a seal is formed between the rollers 76 and the shield 70 as the CRTs 42 move through the apparatus. Such a structure effectively forms a seal, and thus prevents the flow of gases, etc., between adjacent deposition process zones 34.

Figure 13:
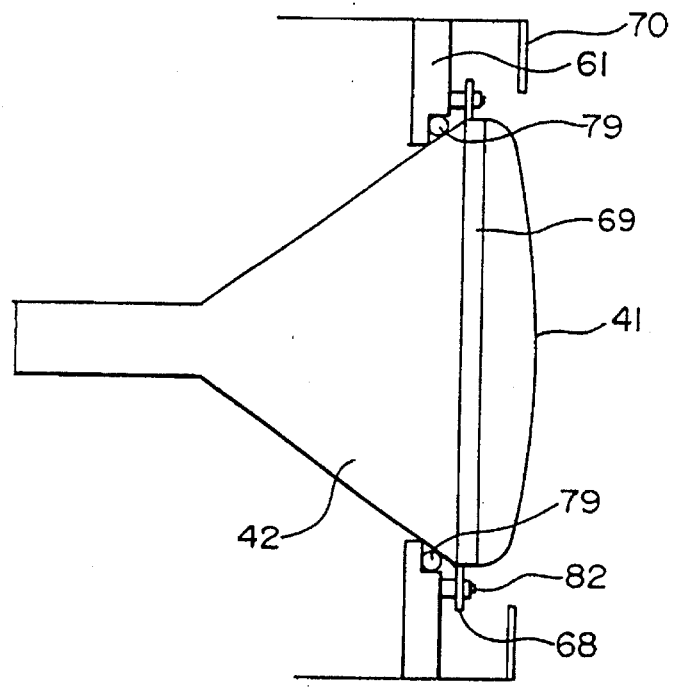
FIG. 13 is a schematic illustration showing an alternate embodiment of a seal means between the CRT and CRT carrier.

FIG. 13 is an illustration of an alternate apparatus for mounting the CRT 42 relative to the carrier and for sealing the same relative to the barrier plate 61. In the embodiment of FIG. 13, an elastomeric seal member 79 engages a portion of the CRT 42 rearwardly of the implosion band 69. The CRT 42 is supported relative to the barrier 61, by the threaded members 82 attached to peripheral ears 68 commonly provided around the CRT periphery. This particular embodiment is preferred where outgasing contaminants present as a result of the assembly of the implosion band 69 can be kept to a minimum. An advantage of this particular embodiment is that the conductive coating applied to the front screen 41 of the CRT 42 can extend up to and include a portion of the band 69, thereby insuring electrical contact between the conductive coating and the band 69 by which static electricity can be dissipated.

Figure 14:
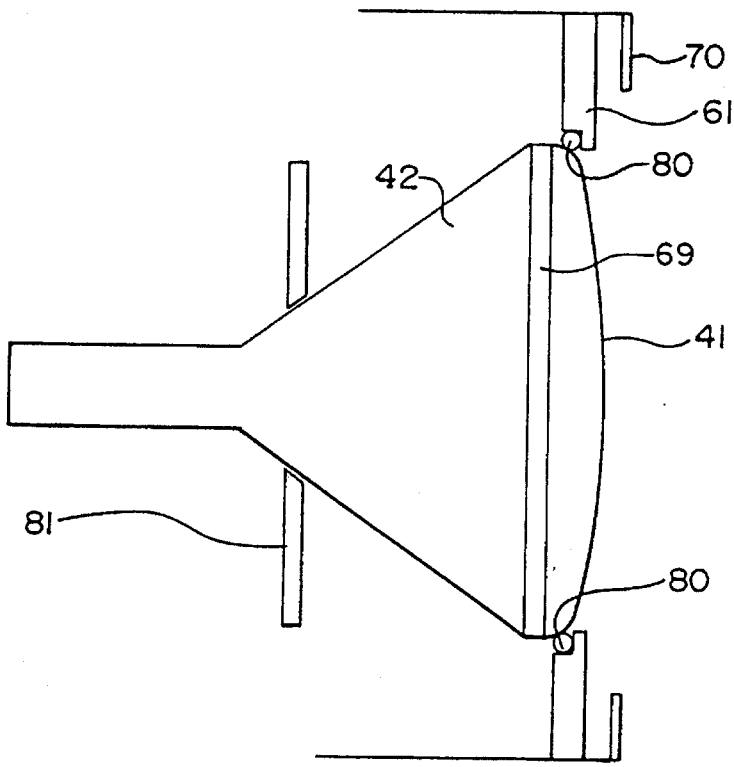
FIG. 14 is a schematic illustration showing a further embodiment of a seal means between the CRT and CRT carrier.

FIG. 14 illustrates a further embodiment for supporting the CRT 42 relative to the carrier and forming a seal between the barrier plate 61 and a peripheral edge of the CRT screen 41. In the embodiment of FIG. 14, an elastomeric seal 80 is positioned forward of the implosion band 69. An advantage of this embodiment is that it isolates the implosion band 69 from the deposition zone 34 and thus prevents or minimizes the band 69 as a source of outgassing. The sealing force and CRT support in the embodiment of FIG. 14 is provided by a yoke or collar 81 which is pressed against a rear surface portion of the CRT 11 by means of springs, etc.

As described above, a principal objective of the present invention is to provide an apparatus and method in which the deposition zone and the exhaust zone are substantially isolated or separated from one another. This prevents or minimizes interference of the deposition process by outgasses from noncoated portions of the article such as an assembled CRT. Substantial isolation or separation of the deposition and exhaust zones in accordance with the present invention can be accomplished in several ways. First by physically separating the two zones by minimizing the gaps between adjacent carrier side edges and between top and bottom carrier edges and the process chamber walls, a partial pressure differential between outgas gases and process gases across the physical barrier is created. A second way is by maintaining a total pressure differential between the deposition and exhaust zones so that prevailing movement of gasses within the process chamber during operation is from the deposition zone to the exhaust zone; and third, by combining the physical separation with the maintenance of a pressure differential.

Physical separation can be maximized by sealing the barrier plate 61 to the article to be coated as shown in FIGS. 8–10, 13 and 14 and by minimizing the gaps between the side edges of adjacent carriers 58 and between the mating top and bottom edges of carriers and barrier portions of the process chamber. Small gaps can, however, be tolerated, particularly if combined with a pressure differential between the deposition and exhaust chambers. Preferably, gaps between the barrier plate 61 and the CRT and between the carrier 58 and mating portions of the process chamber should be maintained at less than about 6 mm and more preferably less than about 3 mm and most preferably less than about 1.5 min. The size of the gap that can be tolerated, however, will depend on the amount of pressure differential between the deposition and exhaust zones and the proximity of the gap to the surface to be coated. A further factor involves the shape of the gap. For example, the movement of gases between zones can be reduced by a serpentine shaped gap.

In the preferred embodiment, the deposition and exhaust zones 34 and 54 are provided with separate pumping systems, 50 and 56 (FIG. 11) respectively. The provision of separate pumping systems facilitates the pressure differential. In the preferred embodiment, the pressures in the deposition zones 34 are maintained in the general range of about $1 \times 10^{-3}$ to $8 \times 10^{-3}$ Torr. In the exhaust zone 54, pressures are preferably maintained in a general range of about $5 \times 10^{-5}$ to $7 \times 10^{-4}$ Torr. Preferably, the pressure differential between the zones is such that the deposition zone pressure exceeds the exhaust zone pressure by a factor of at least two and more preferably at least five.

Having described the structure of the present apparatus, the operation of the apparatus and the method of the present invention can be understood best as follows.

First, in accordance with the method of the preferred embodiment, a fully assembled CRT 42 is mounted to a CRT carrier 58 as illustrated in the preferred embodiment of FIGS. 2, 3 and 4 or any one of the various alternate embodiments. For this purpose, the carrier may be a single CRT carrier 58 as shown in FIGS. 2–6 or may be a double CRT carrier 58 as illustrated in the schematic view of FIG. 7. In either case, the carrier is provided with a barrier plate 61 having an opening substantially conforming in size and configuration to a peripheral surface of the CRT 42. A forwardly spaced mask or shield member 70 with an opening 71 may also abe provided as shown in the embodiment of FIGS. 7 and 16. Alternatively, the member 70 can be eliminated as shown in the embodiment of FIGS. 15 and 17. In the embodiment of FIGS. 7 and 16, a film 74 may optionally be provided between the openings 71 and 64 to improve isolation of the deposition zones 34 and the front face 41 of the CRT 42 from contaminating outgasses. Although it is preferable for the opening 64 in the barrier plate 61 to be sealed to a peripheral surface of the CRT 42, a total seal is not necessary. In fact, a small gap can be tolerated provided the partial pressures of gasses within the deposition zones 34 and the exhaust zone 54 are such as to preclude migration of outgasses from the exhaust zone 54 into the deposition zones 34.

Figure 5:
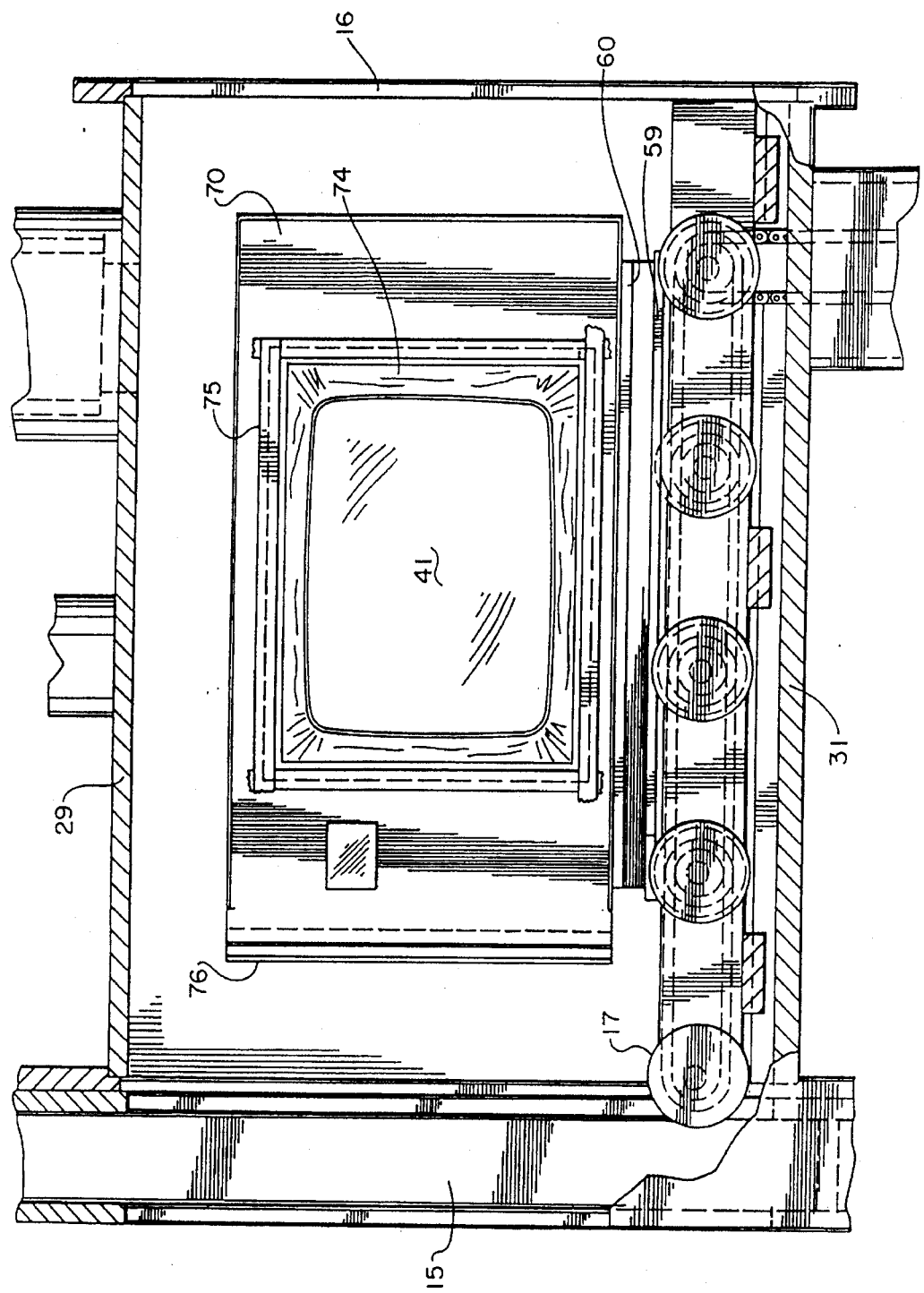
FIG. 5 is a front elevational view of the CRT carrier of FIG. 2 positioned within the entry buffer chamber of the apparatus of FIG. 1.

After the CRT 42 has been mounted to the CRT carrier 58, the gate valve 16 (FIG. 1) is dosed and the air supply means 20 is actuated to provide the interior of the entry buffer chamber 12 with atmospheric pressure. The door 15 is then opened and the carrier 58 with the attached CRT 42 is positioned within the entry buffer zone 12 as illustrated in FIGS. 5 and 6. In this position, the base 59 of the carrier 58 is positioned on the transport rollers 17. The door 15 is then closed and latched and the air exhaust means 21 actuated to create vacuum conditions within the chamber 12 substantially identical to those within the exhaust zone 54. The gate valve 16 is then raised and the carrier with mounted CRT 42 is transported into the process section 11. When the carrier 58 and CRT 42 are positioned within the section 11, the gate valve 16 may be closed, the chamber 12 brought to atmospheric pressure and a new carrier and CRT introduced into the chamber 12 to repeat the cycle.

Within the section 11, the carrier 58 and CRT 42 are progressively moved along so that the front face 41 of the CRT is progressively moved past the various deposition process zones 34 for sequential deposition of a thin film coating by the sputtering apparatus 35 and 38 provided in each of the zones 34. Because it is possible and common for adjacent process zones 34 to utilize different working gasses, as well as different materials, it is preferable for each of the zones 14 to be provided with separate evacuation pumps or pump systems 50 (FIG. 11).

To minimize the contamination of working gasses and the like from one deposition zone 34 to another, it is preferable during movement of the CRTs through the section 11 for the mask or shield portion 70 of the carrier 58 be positioned as dose to the walls 45 and shield surfaces 46 as possible.

Figure 11:
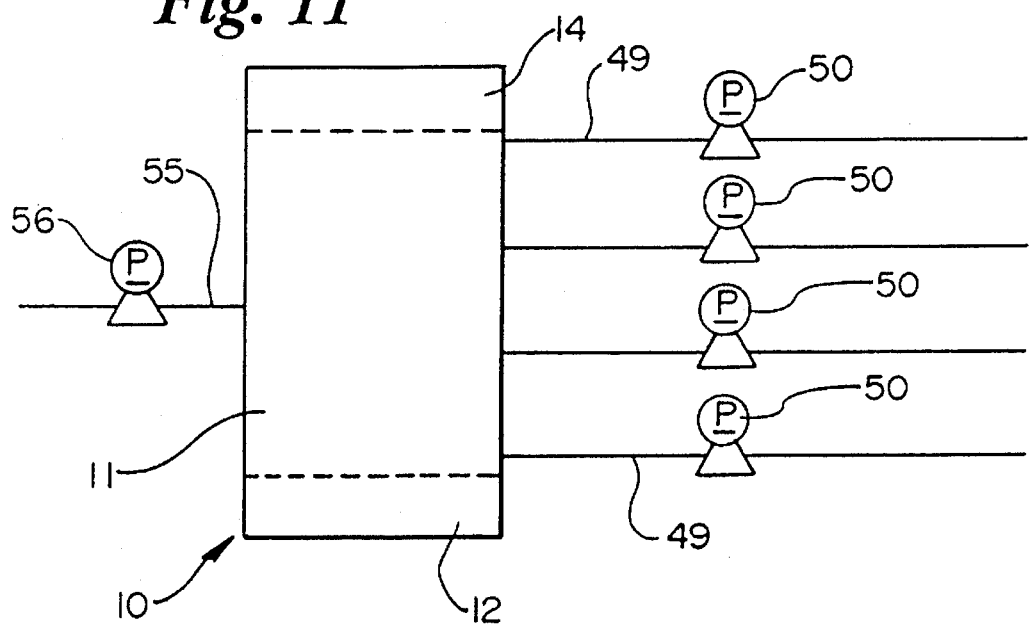
FIG. 11 is a schematic illustration of the apparatus of the present invention showing the vacuum pumps connected with the deposition and exhaust zones.

During the deposition process reduced pressure conditions are maintained within the zones 34 by the vacuum pumps 50 (FIG. 11) and in the exhaust zone 54 by the vacuum pump 56 (FIG. 11). Preferably, the vacuum levels maintained in the deposition zones 34 are slightly greater than that in the exhaust zone 54 so that a pressure differential is created. Thus, the prevailing movement of gases, etc., although minimized as a result of maintaining minimal gaps between the barrier plate and the CRT and process chamber walls, is from the deposition zones 34 to the exhaust zone 54.

In the above identified apparatus and method, to the extent outgasses are released from electronic and other components of the assembled CRT 42, they are isolated from the deposition process zones 34. Thus, such outgasses are effectively prevented from interference with the deposition process. This represents a significant advancement in the art and facilitates the thin film coating of an article such as a CRT screen after the CRT has been substantially and fully assembled.

Although the description of the preferred embodiment and method have been quite specific, it is contemplated that various modifications could be made without deviating from the spirit of the present invention. Accordingly, it is intended that the scope of the present invention be dictated by the appended claims rather than by the description of the preferred embodiment.

We claim:

1. An apparatus for providing a thin film coating to an assembled cathode ray tube in which said cathode ray tube includes a front face portion to be coated and a rearward funnel portion comprising the remaining surface of said cathode ray tube, said apparatus comprising:

a process chamber having an interior surface, first and second ends, a deposition zone and an exhaust zone;

a plurality of cathode ray tube carriers moveable through said process chamber from said first end to said second end, said carriers associated with the interior surface of said process chamber and with adjacent carriers to substantially define said deposition and exhaust zones, each of said carriers having a first surface facing said deposition zone and a second, opposite surface facing said exhaust zone, at least one of said carriers having a mounting opening for a cathode ray tube and a cathode ray tube support for supporting a cathode ray tube in said opening with said front face portion facing and exposed to said deposition zone and said funnel portion facing and exposed to said exhaust zone; and a thin film deposition device in said deposition zone.

2. The apparatus of claim 1 wherein said thin film deposition device is a sputtering device.

3. The apparatus of claim 2 wherein said sputtering device is a magnetron sputtering device.

4. The apparatus of claim 1 wherein each of said carriers comprises a barrier plate having said first and second surfaces and said opening and further having a peripheral edge associated with the interior surface of said process chamber and with adjacent carriers.

5. The apparatus of claim 4 wherein said mounting opening includes a seal member for sealing engagement with said cathode ray tube along a seal line rearwardly of said implosion band.

6. The apparatus of claim 4 wherein said cathode ray tube includes an outer edge and said mounting opening includes a seal member for sealing engagement with said cathode ray tube along said outer edge.

7. The apparatus of claim 1 including a first pump system for maintaining said deposition process zone at a first reduced pressure level and a second, separate pump system for maintaining said exhaust zone at a second reduced pressure level.

8. The apparatus of claim 7 wherein said separation means substantially physically isolates said deposition and exhaust zones by maintaining gaps between said zones of less than about 6 mm.

9. The apparatus of claim 7 wherein said second reduced pressure is smaller than said first reduced pressure by a factor of at least about two.

10. The apparatus of claim 1 wherein said first and second surfaces are vertically oriented and said cathode ray tube support supports the cathode ray tube with its front face portion in a vertical orientation.

11. The apparatus of claim 1 being an in-line, continuous apparatus having an entry chamber and an exit chamber positioned adjacent to said first and second ends, respectively.

12. The apparatus of claim 1 wherein said carrier includes top and bottom edges for mating association with said interior surface during movement of said carrier through said process chamber and side edges for mating association with adjacent carriers.

13. An apparatus for selectively providing a thin film coating to an article in which said article includes a first surface portion to be coated and a second surface portion which is uncoated and which comprises the remaining surface of said article, said apparatus comprising:

a process chamber having an interior surface and first and second ends;

a plurality of carriers movable through said process chamber from said first end to said second end, said carriers comprising a separation barrier having an outer edge associated with the interior surface of said process chamber and with adjacent carriers to substantially define and separate said process chamber into a deposition zone and an exhaust zone;

a thin film deposition device in said deposition zone;

each of said barriers having a first surface facing said deposition zone and a second surface facing said exhaust zone and at least one of said barriers having an article support comprised of a mounting opening for supporting an article in which the first surface portion of said article is exposed to said deposition zone and the second surface portion of the article is exposed to said exhaust zone.

14. The apparatus of claim 13 wherein said process chamber includes a mating surface portion and said outer edge includes a mating edge portion for mating association with said mating surface portion.

15. The apparatus of claim 14 wherein said outer edge further includes side edge portions for mating association with side edge portions of barriers of adjacent carriers.

16. A carrier for supporting a fully assembled CRT for use in a coating process in an apparatus having a deposition zone and an exhaust zone and a deposition device for providing a thin film coating to the front face portion of the CRT in the deposition zone, said carrier comprising:

a base;

a barrier plate having at least one mounting opening for mating association with a peripheral surface portion of said CRT and further having an outer edge having a first edge portion for mating association with the barrier plate of an adjacent carrier and a second edge portion for mating association with said apparatus to substantially separate said deposition zone from said exhaust zone.

* * * * *